(12) United States Patent
Ishihara et al.

(10) Patent No.: US 10,004,143 B2
(45) Date of Patent: Jun. 19, 2018

(54) PRINTED WIRING BOARD AND METHOD FOR MANUFACTURING PRINTED WIRING BOARD

(71) Applicant: IBIDEN CO., LTD., Ogaki (JP)

(72) Inventors: Teruyuki Ishihara, Ogaki (JP); Haiying Mei, Ogaki (JP); Hiroyuki Ban, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days. days.

(21) Appl. No.: 15/252,286

(22) Filed: Aug. 31, 2016

(65) Prior Publication Data

US 2017/0064835 A1  Mar. 2, 2017

(30) Foreign Application Priority Data

Aug. 31, 2015  (JP) .................................. 2015-170314

(51) Int. Cl.
*H05K 1/03* (2006.01)
*H05K 1/18* (2006.01)
(Continued)

(52) U.S. Cl.
CPC ........... *H05K 1/183* (2013.01); *H01L 21/486* (2013.01); *H01L 21/4857* (2013.01);
(Continued)

(58) Field of Classification Search
CPC .. H05K 1/00; H05K 1/02; H05K 1/03; H05K 1/09; H05K 1/11; H05K 1/14; H05K 1/18; H05K 3/00; H05K 3/10; H05K 3/30; H05K 3/36; H05K 3/40; H05K 3/42; H05K 3/46; H01L 21/48; H01L 21/58; H01L 21/60; H01L 23/02; H01L 23/10; H01L 23/14;
(Continued)

(56) References Cited

U.S. PATENT DOCUMENTS 5,999,415 A * 12/1999 Hamzehdoost ....... H01L 23/047
257/703
6,324,067 B1 * 11/2001 Nishiyama ............. H05K 1/165
174/262

(Continued)

FOREIGN PATENT DOCUMENTS

JP        2015-060912 A       3/2015

*Primary Examiner* — Xiaoliang Chen
(74) *Attorney, Agent, or Firm* — Oblon, McClelland, Maier & Neustadt, L.L.P.

(57) ABSTRACT

A printed wiring board includes a first circuit substrate having a first surface and a second surface on the opposite side, and a second circuit substrate having a third surface and a fourth surface on the opposite side such that the first circuit substrate is laminated on the third surface and that the first surface and the third surface are opposing each other. The second circuit substrate has a mounting area on the third surface and includes pads positioned to mount an electronic component in the mounting area and a connection wire structure connected to the pads, and the first circuit substrate includes through-hole conductors extending from the first surface to the second surface and connected to the pads through the connection wire structure and has an opening portion formed through the first circuit substrate such that the opening portion is exposing the pads formed in the mounting area.

15 Claims, 12 Drawing Sheets

(51) Int. Cl.
*H01L 23/538* (2006.01)
*H01L 21/48* (2006.01)
*H01L 21/683* (2006.01)
*H05K 3/46* (2006.01)
*H01L 23/13* (2006.01)
*H01L 23/498* (2006.01)
*H05K 3/00* (2006.01)
*H05K 3/20* (2006.01)
*H01L 23/31* (2006.01)
*H01L 25/10* (2006.01)

(52) U.S. Cl.
CPC .......... *H01L 21/6835* (2013.01); *H01L 23/13* (2013.01); *H01L 23/49822* (2013.01); *H01L 23/49827* (2013.01); *H01L 23/5383* (2013.01); *H01L 23/5384* (2013.01); *H01L 23/5386* (2013.01); *H01L 23/5389* (2013.01); *H05K 3/4682* (2013.01); *H05K 3/4697* (2013.01); H01L 23/3128 (2013.01); H01L 25/105 (2013.01); H01L 2221/68345 (2013.01); H01L 2224/16227 (2013.01); H01L 2224/16235 (2013.01); H01L 2224/32145 (2013.01); H01L 2224/48091 (2013.01); H01L 2224/48227 (2013.01); H01L 2225/0651 (2013.01); H01L 2225/1023 (2013.01); H01L 2225/1058 (2013.01); H01L 2924/1533 (2013.01); H01L 2924/15153 (2013.01); H01L 2924/15192 (2013.01); H01L 2924/15311 (2013.01); H05K 3/0097 (2013.01); H05K 3/205 (2013.01); H05K 2201/09127 (2013.01)

(58) Field of Classification Search
CPC ......... H01L 23/28; H01L 23/34; H01L 23/36; H01L 23/42; H01L 23/46; H01L 23/48; H01L 23/52; H01L 23/485; H01L 23/488
USPC ....... 174/255, 254, 257, 258, 260, 262, 264, 174/266; 361/752, 753, 760, 761, 782, 361/792, 803; 438/29, 107, 108, 618; 257/678, 692, 700, 702, 734, 738, 774, 257/778
See application file for complete search history.

(56) References Cited

U.S. PATENT DOCUMENTS

| | | | | |
|---|---|---|---|---|
| 6,582,991 B1* | 6/2003 | Maeda | ............. | H01L 24/81 257/778 |
| 2002/0079575 A1* | 6/2002 | Hozoji | ............. | H01L 23/49816 257/734 |
| 2002/0144775 A1* | 10/2002 | Tung | ............. | H01L 23/10 156/303.1 |
| 2004/0178510 A1* | 9/2004 | Sunohara | ............. | H01L 23/481 257/781 |
| 2004/0183187 A1* | 9/2004 | Yamasaki | ......... | H01L 21/76898 257/700 |
| 2005/0048759 A1* | 3/2005 | Hsu | ............. | H01L 23/36 438/618 |
| 2005/0105860 A1* | 5/2005 | Oono | ............. | G02B 6/4206 385/88 |
| 2005/0205979 A1* | 9/2005 | Shin | ............. | H01L 23/13 257/678 |
| 2006/0051895 A1* | 3/2006 | Abe | ............. | H01L 21/563 438/108 |
| 2006/0091509 A1* | 5/2006 | Zhao | ............. | H01L 23/055 257/678 |
| 2006/0091542 A1* | 5/2006 | Zhao | ............. | H01L 21/565 257/738 |
| 2006/0237225 A1* | 10/2006 | Kariya | ............. | H01L 23/49827 174/260 |
| 2007/0095471 A1* | 5/2007 | Ito | ............. | H01L 23/5385 156/293 |
| 2008/0150065 A1* | 6/2008 | Oda | ............. | H01L 31/0203 257/434 |
| 2008/0277776 A1* | 11/2008 | Enomoto | ............. | H01L 21/486 257/700 |
| 2009/0026604 A1* | 1/2009 | Shin | ............. | H01L 21/4857 257/702 |
| 2009/0140415 A1* | 6/2009 | Furuta | ............. | H01L 23/49833 257/700 |
| 2009/0175017 A1* | 7/2009 | Kita | ............. | H01L 21/481 361/792 |
| 2009/0283895 A1* | 11/2009 | Kikuchi | ............. | H01L 23/5389 257/692 |
| 2010/0148196 A1* | 6/2010 | Kamada | ............. | F21K 9/00 257/98 |
| 2010/0170700 A1* | 7/2010 | Nakamura | ............. | H05K 1/183 174/254 |
| 2010/0320622 A1* | 12/2010 | Machida | ............. | H01L 23/49822 257/778 |
| 2011/0240354 A1* | 10/2011 | Furuhata | ............. | H01L 21/568 174/258 |
| 2011/0240357 A1* | 10/2011 | Kariya | ............. | H01L 23/5389 174/266 |
| 2011/0316170 A1* | 12/2011 | Muramatsu | ....... | H01L 23/49816 257/774 |
| 2012/0081864 A1* | 4/2012 | Sakurai | ............. | H01L 23/49822 361/753 |
| 2012/0212919 A1* | 8/2012 | Mano | ............. | H05K 1/185 361/782 |
| 2013/0182401 A1* | 7/2013 | Furutani | ............. | H05K 1/0296 361/782 |
| 2013/0194764 A1* | 8/2013 | Mikado | ............. | H05K 1/185 361/761 |
| 2014/0054773 A1* | 2/2014 | Kurashima | ............. | H01L 23/28 257/738 |
| 2014/0092569 A1* | 4/2014 | Sakurai | ............. | H05K 3/4697 361/752 |
| 2015/0062849 A1* | 3/2015 | Adachi | ............. | H05K 1/185 361/761 |
| 2015/0083476 A1* | 3/2015 | Kim | ............. | H05K 1/113 174/260 |
| 2015/0136459 A1* | 5/2015 | Kunieda | ............. | H05K 3/4682 174/257 |
| 2015/0252258 A1* | 9/2015 | Konishi | ............. | C09K 11/77 438/29 |
| 2015/0366061 A1* | 12/2015 | Noda | ............. | H01L 23/13 361/803 |
| 2015/0366062 A1* | 12/2015 | Noda | ............. | H01L 25/105 361/803 |

* cited by examiner

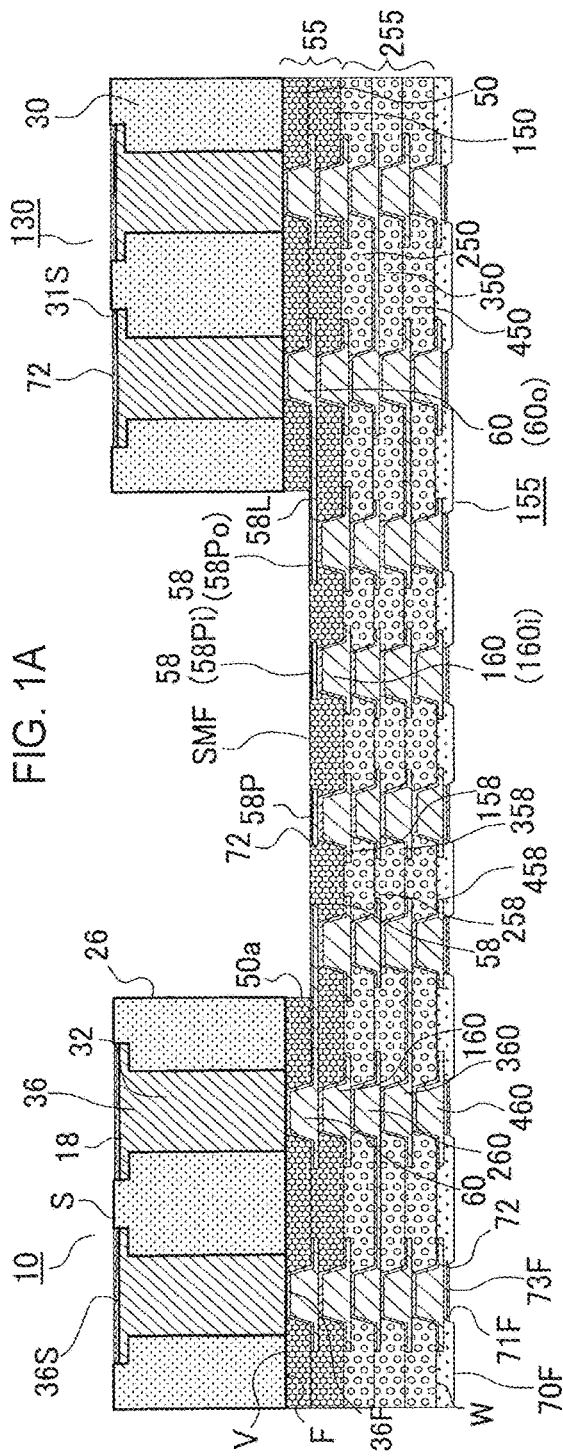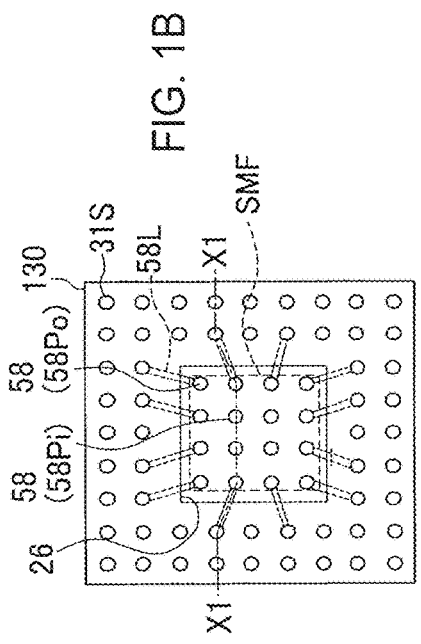

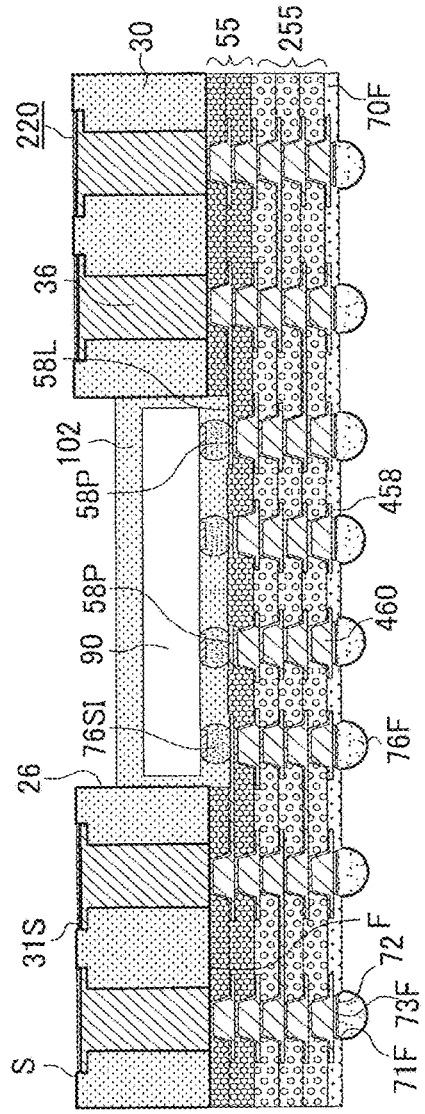
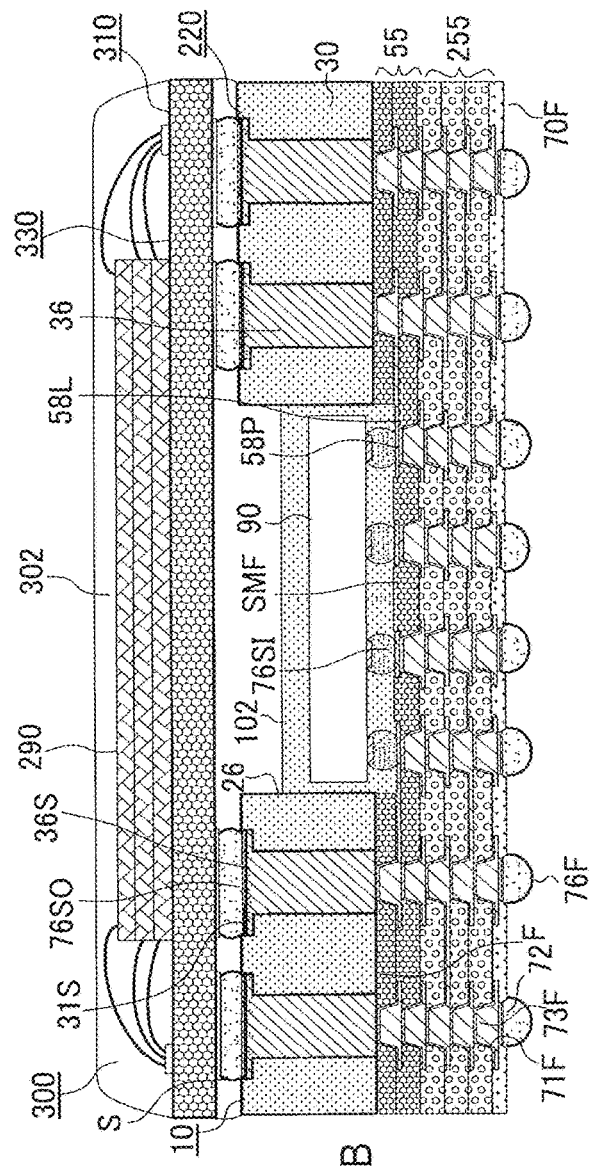
FIG. 2A
FIG. 2B

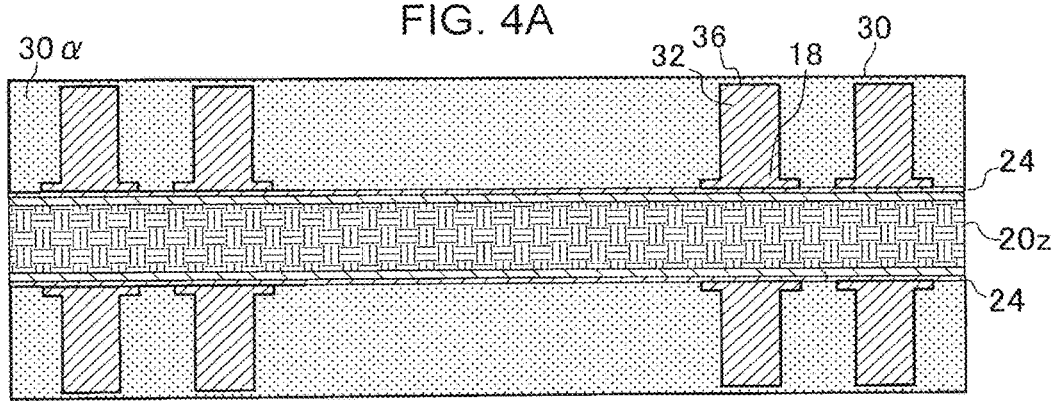
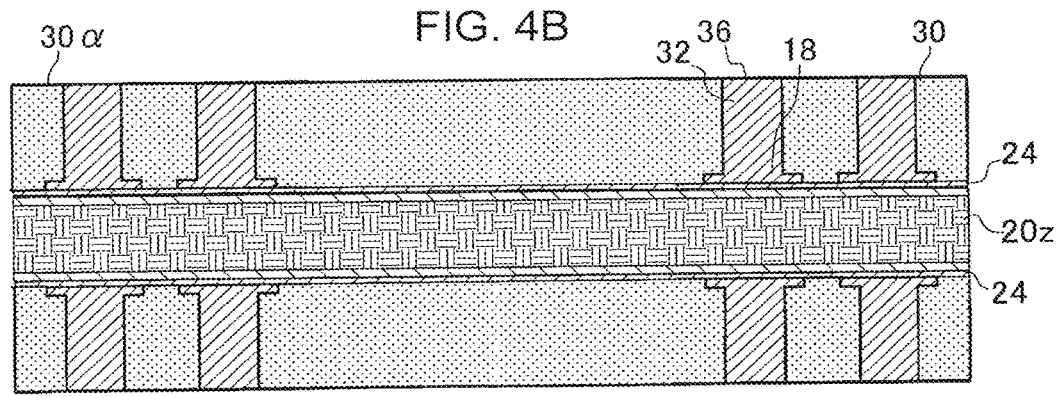
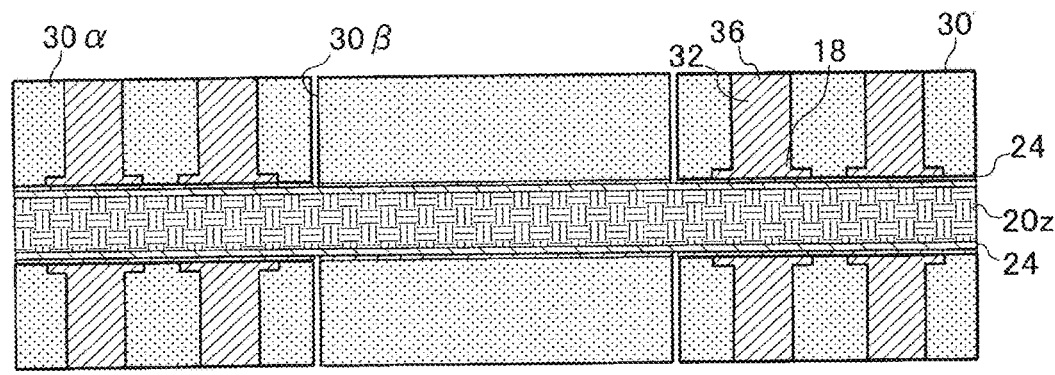

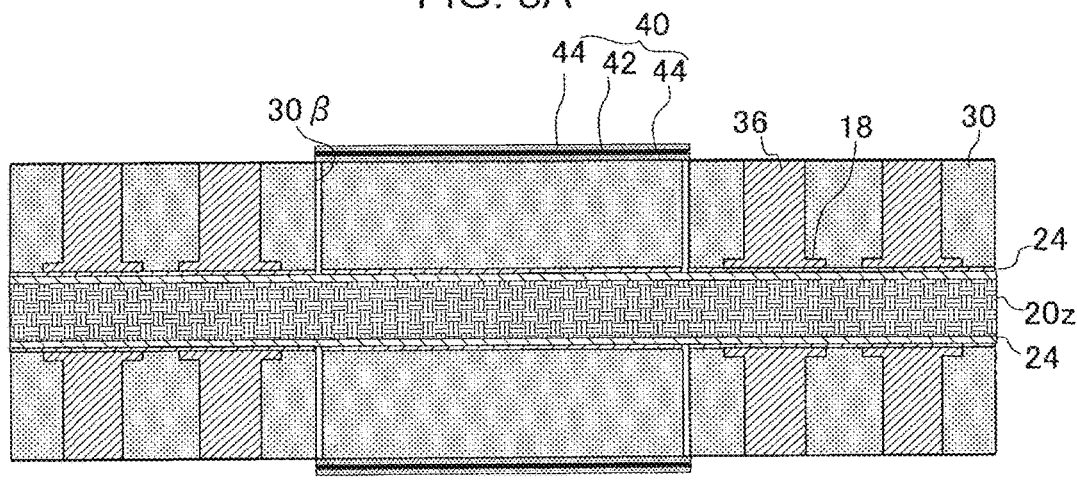
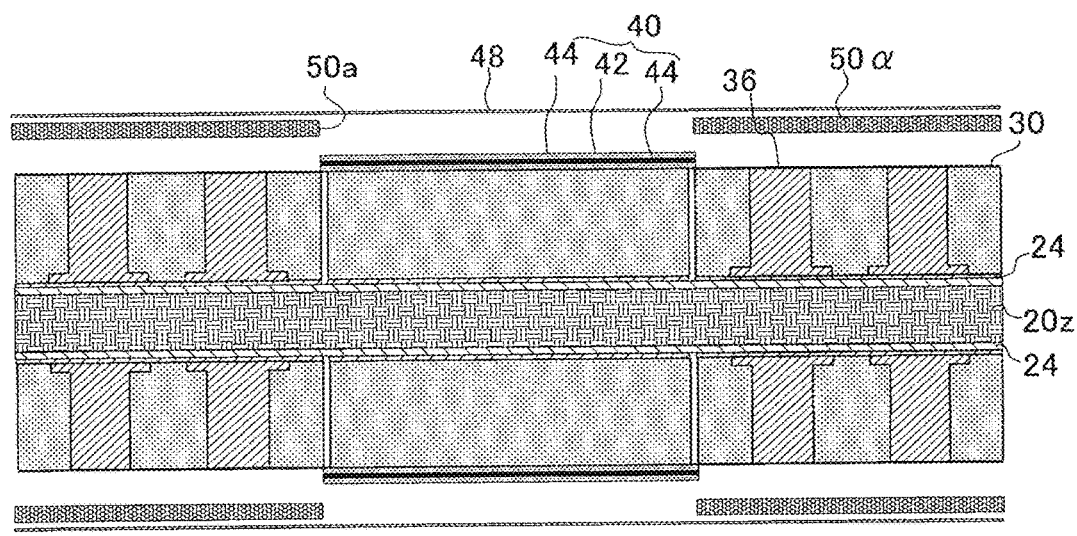

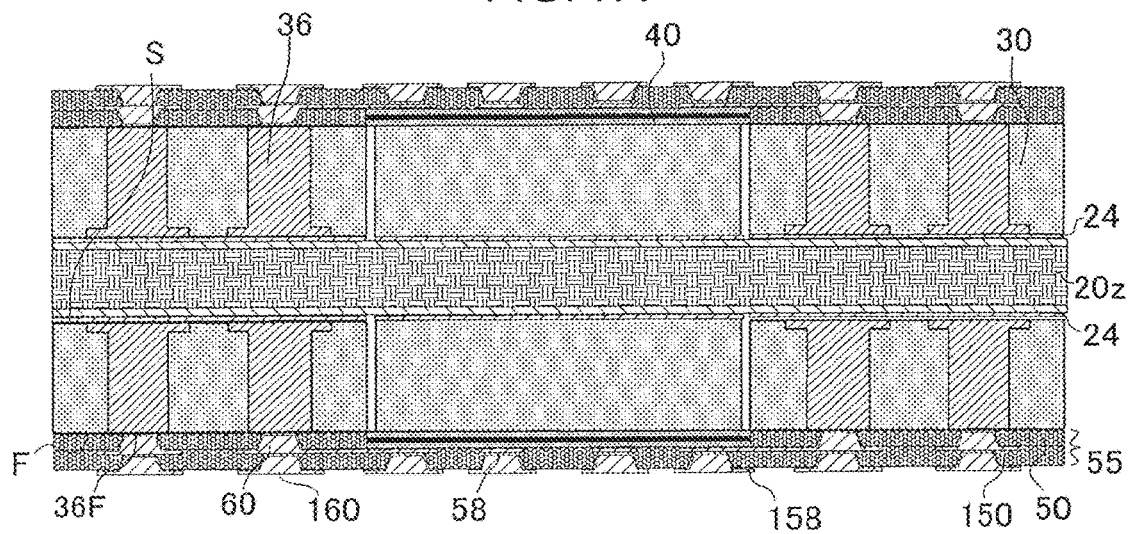
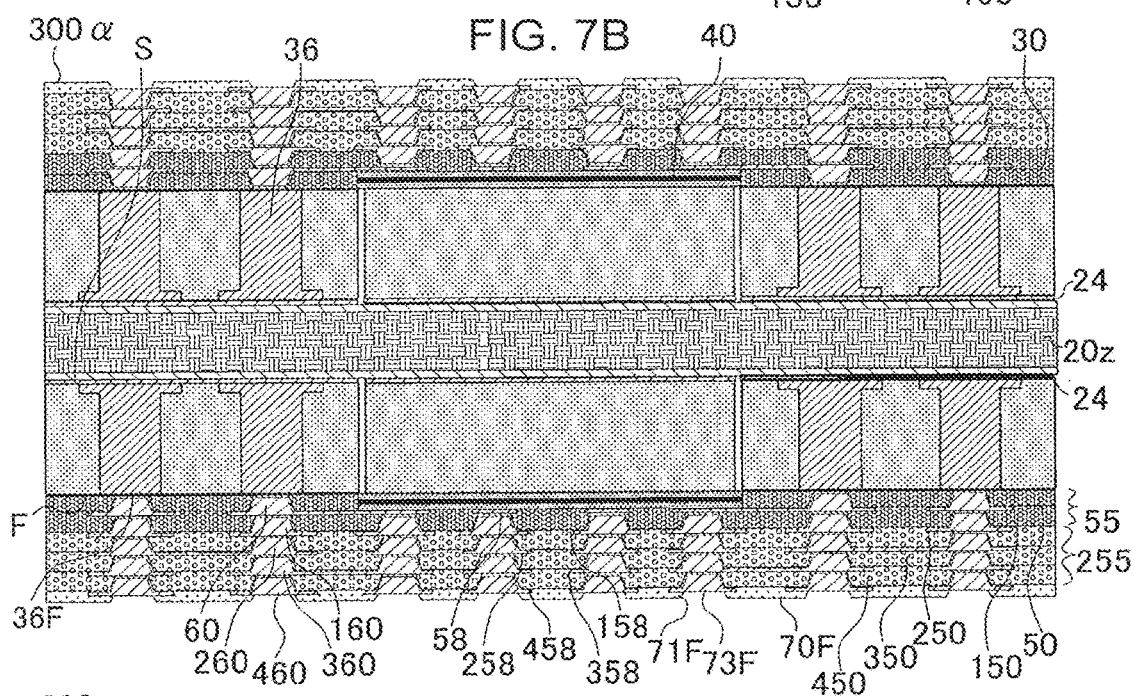
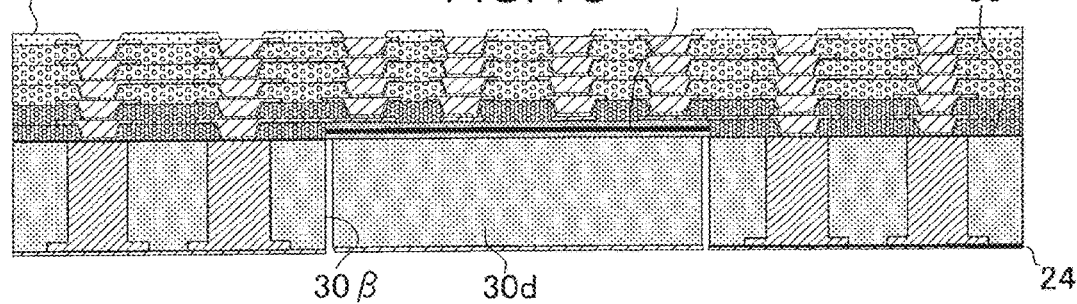

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2015-170314, filed Aug. 31, 2015, the entire contents of which are incorporated herein by reference.

BACKGROUND OF THE INVENTION

Field of the Invention

The present invention relates to a printed wiring board and a method for manufacturing the printed wiring board, the printed wiring board having a cavity for exposing a mounting area.

Description of Background Art

Japanese Patent Laid-Open Publication No. 2015-60912 describes a package substrate for mounting a semiconductor element, the package substrate including a multilayer base substrate and a cavity substrate, the base substrate having a mounting area for mounting an electronic component, and the cavity substrate having a cavity for exposing the mounting area. The entire contents of this publication are incorporated herein by reference.

SUMMARY OF THE INVENTION

According to one aspect of the present invention, a printed wiring board includes a first circuit substrate having a first surface and a second surface on the opposite side with respect to the first surface, and a second circuit substrate having a third surface and a fourth surface on the opposite side with respect to the third surface such that the first circuit substrate is laminated on the third surface and that the first surface and the third surface are opposing each other. The second circuit substrate has a mounting area on the third surface and includes pads positioned to mount an electronic component in the mounting area and a connection wire structure connected to the pads, and the first circuit substrate includes through-hole conductors extending from the first surface to the second surface and connected to the pads through the connection wire structure and has an opening portion formed through the first circuit substrate such that the opening portion is exposing the pads formed in the mounting area.

According to another aspect of the present invention, a method for manufacturing a printed wiring board includes forming metal posts on a support plate, forming, on the support plate, an insulating layer of a first circuit substrate such that the metal posts are buried in the insulating layer, forming a frame-shaped groove for an opening portion of the first circuit substrate in the insulating layer such that the frame-shaped groove reaches the support plate, forming a release layer on a surface of the insulating layer such that the release layer extends to cover the frame-shaped groove, forming, on the surface of the insulating layer, a first resin insulating layer of a second circuit substrate such that the first resin insulating layer has an opening portion in which the release layer formed on the insulating layer of the first circuit substrate penetrates through the first resin insulating layer, forming via conductors penetrating through the first resin insulating layer, pads on the release layer, and a connection wire structure extending on the release layer and the first resin insulating layer such that the via conductors are positioned to connect to the metal posts, the pads are position to mount an electronic component, and the connection wire structure is connecting the via conductors and the pads, removing the support plate from the insulating layer of a first circuit substrate such that the support plate is separated from a structure including the insulating layer of the first circuit substrate and the first resin insulating layer of the second circuit substrate, removing a portion of the insulating layer surrounded by the frame-shaped groove from the structure including the insulating layer of the first circuit substrate and the first resin insulating layer of the second circuit substrate such that the opening portion of the first circuit substrate is formed in the insulating layer of the first circuit substrate, and removing the release layer from the structure including the insulating layer of the first circuit substrate and the first resin insulating layer of the second circuit substrate such that a mounting area for mounting the electronic component on the second circuit substrate is formed by exposing in the opening portion of the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of a printed wiring board according to a first embodiment of the present invention;

FIG. 1B is a plan view illustrating a first circuit substrate and a mounting area that is exposed from an opening of the first circuit substrate;

FIG. 2A is a cross-sectional view of a semiconductor device according to the first embodiment;

FIG. 2B is a cross-sectional view of an application example of the semiconductor device;

FIG. 4A-4C are manufacturing process diagrams of the printed wiring board of the first embodiment;

FIGS. 5A and 5B are manufacturing process diagrams of the printed wiring board of the first embodiment;

FIG. 7A-7C are manufacturing process diagrams of the printed wiring board of the first embodiment;

DETAILED DESCRIPTION OF THE EMBODIMENTS

Figure 3A:
FIG. 3A-3E are manufacturing process diagrams of the printed wiring board of the first embodiment.

The embodiments will now be described with reference to the accompanying drawings, wherein like reference numerals designate corresponding or identical elements throughout the various drawings.

First Embodiment

FIG. 1A illustrates a printed wiring board 10 of a first embodiment. The printed wiring board 10 of the first embodiment includes a first circuit substrate 130 that has a first surface (F) and a second surface (S) that is on an opposite side of the first surface (F), and a second circuit substrate 155 that has a third surface (V) and a fourth surface (W) that is on an opposite side of the third surface (V).

The second circuit substrate 155 illustrated in FIG. 1A is formed by a first build-up layer 55 that includes conductor layers (58, 158), a first resin insulating layer 50 and a second resin insulating layer 150 that are alternately laminated, and a second build-up layer 255 that includes conductor layers (258, 358, 458), a third resin insulating layer 250, a fourth resin insulating layer 350 and fifth resin insulating layer 450 that are alternately laminated. The second circuit substrate 155 is laminated on the first surface (F) of the first circuit substrate 130. The third surface (V) of the second circuit substrate and the first surface (F) of the first circuit substrate are in contact with each other. The first resin insulating layer 50 and the second resin insulating layer 150 that form the first build-up layer 55 of the second circuit substrate are formed from a reinforcing material, a resin such as epoxy, and inorganic particles (inorganic filler) such as silica or alumina. Examples of the reinforcing material include a glass fiber, a glass cloth and an aramid fiber. The third resin insulating layer 250, the fourth resin insulating layer 350 and the fifth resin insulating layer 450 that form the second build-up layer 255 of the second circuit substrate are formed from a resin and inorganic particles, and do not contain a reinforcing material. Via conductors (60, 160, 260, 360, 460) that respectively penetrate the resin insulating layers (50, 150, 250, 350, 450) are respectively formed on the resin insulating layers. The via conductors are each formed in a tapered shape that is gradually reduced in diameter from the fourth surface (W) side toward the third surface (V) side. Conductor layers that are adjacent to each other are connected by the via conductors.

The second circuit substrate 155 has a mounting area (SMF) illustrated in FIG. 1B at a substantially central portion of the third surface (V). An X1-X1 cross section in FIG. 1B corresponds to FIG. 1A. The mounting area is exposed by an opening 26 of the first circuit substrate. An electronic component such as an IC chip is mounted in the mounting area.

The first circuit substrate 130 illustrated in FIG. 1A is formed by an insulating layer 30, through-hole conductors 36, and first terminals (36F) and second terminals (36S) of the through-hole conductors 36, the insulating layer 30 being formed from a mold resin that contains inorganic particles, and the through-hole conductors 36 being formed from metal posts. The insulating layer has the first surface (F) and the second surface (S) that is on the opposite side of the first surface (F). The first terminals (36F) are formed on the first surface, and the second terminals (36S) are formed on the second surface. The first circuit substrate further has the opening 26 for exposing the mounting area (SMF) of the second circuit substrate.

As illustrated in FIG. 1A, the mounting area (SMF) is formed on the second resin insulating layer 150. The first resin insulating layer 50 has an opening (50a) for exposing the mounting area (SMF) of the second resin insulating layer. Pads (58P) for mounting an electronic component are provided on the mounting area (SMF) of the second resin insulating layer. The pads (58P) include first pads (58Pi) that are connected to via conductors (160i) that penetrate the second resin insulating layer 150, and second pads (58Po) that are connected to the via conductors 160o and connection wires (58L). The other ends of the connection wires (58L) on opposite sides of the second pads (58Po) are connected to via conductors (60o) that are connected to the through-hole conductors 36 of the first circuit substrate 130. The pads (58P) and the connection wires (58L) form a part of the conductor layer 58. As illustrated in FIG. 1B, the first pads (58Pi) are provided on a center side of the mounting area (SMF), and the second pads (58Po) are provided on an outer side of the mounting area (SMF). The second pads (58Po) are connected via the connection wires (58L) so as to laterally extend (fan-out). The connection wires (58L) are exposed inside the opening (50a) and are covered by the first resin insulating layer 50 outside the opening (50a). The portion of each of the connection wires (58L) that is exposed inside the opening (50a) has a thin thickness, and the portion of each of the connection wires (58L) that is covered by the first resin insulating layer 50 outside the opening (50a) has a thick thickness.

The printed wiring board can have a solder resist layer (70F) of the build-up layer on the outermost fifth resin insulating layer 450 and the outermost conductor layer 458 of the second circuit substrate. Openings (71F) that expose the conductor layer (uppermost conductor layer) 458 are formed in the solder resist layer (70F) of the build-up layer. Portions of the conductor layer 458 that are exposed by the openings (71F) function as pads (73F) that connect to a motherboard.

A protective film 72 can be formed on each of the pads (73F). The protective films are films for preventing oxidation of the pads. The protective films are each formed, for example, by a Ni/Au, Ni/Pd/Au, Pd/Au or OSP (Organic Solderability Preservative) film. A protective film can be formed on each of the pads (58P) and on each of the portions of the connection wires (58L) that are exposed inside the opening (50a).

Figure 9:
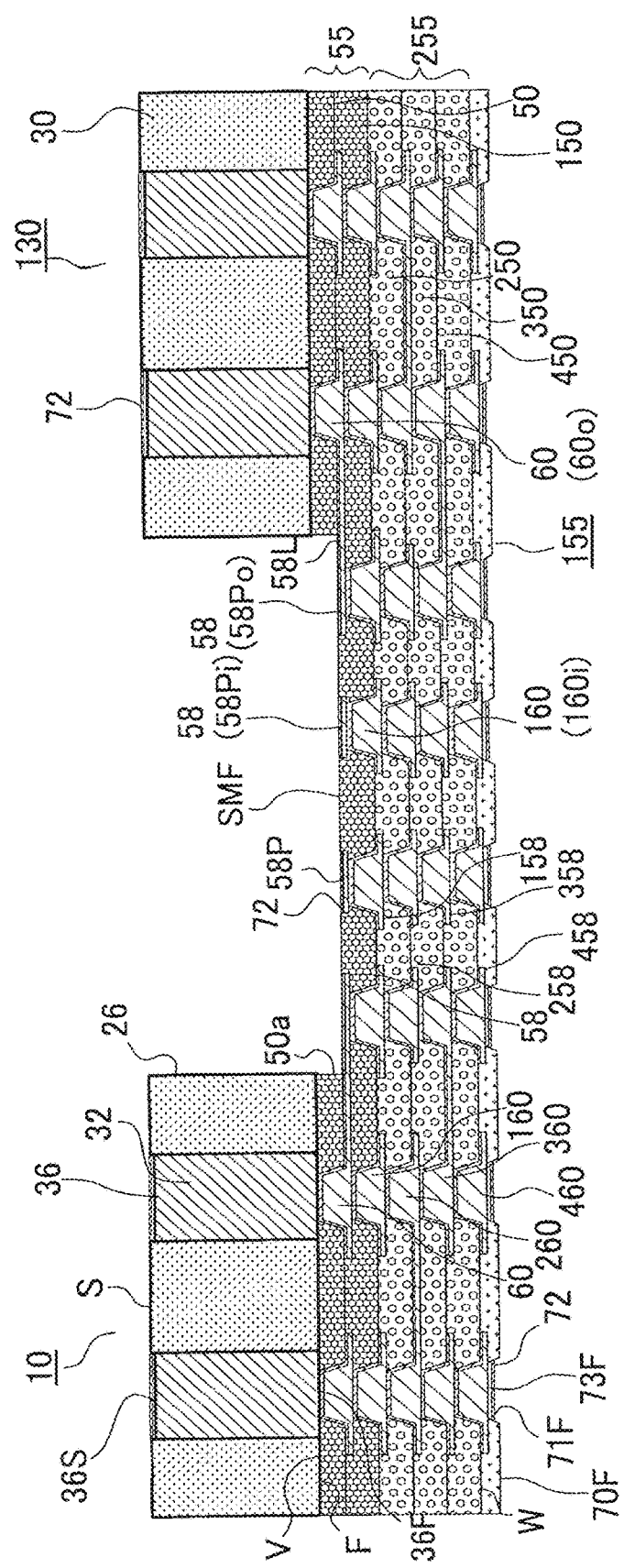
FIG. 9 is a cross-sectional view of a printed wiring board according to a modified embodiment of the first embodiment of the present invention.

The through-hole conductors 36 of the first circuit substrate 130 are each formed from an embedded wiring 18 that is formed on the second surface (S) side and a column-shaped metal post 32. However, as illustrated in FIG. 9, it is possible that the embedded wiring 18 on the second surface (S) side is provided or not provided. The first terminals (36F) of the through-hole conductors 36 are respectively formed by first surface (F) side end portions of the metal posts 32. The first terminals (36F) are formed on substantially the same plane as the first surface (F) of the first circuit substrate 130. The second terminals (36S) of the through-hole conductors 36 on the second surface (S) side are formed by exposed surfaces of the embedded wirings 18 on the second surface (S) side. The second terminals (36S) are recessed from the second surface (S) of the first circuit substrate 130. The first circuit substrate 130 has openings (31S) that respectively expose the second terminals (36S) that are recessed from the second surface (S). A protective film 72 can be formed on each of the second terminal (36S).

FIG. 2A illustrates a first application example (semiconductor device) 220 of the printed wiring board 10 of the present embodiment. The first application example 220 is a package substrate (first package substrate).

In the semiconductor device 220, an electronic component 90 such as an IC chip is accommodated in the opening 26 of the first circuit substrate 130. An IC chip 90 is mounted by solder bumps (76SI) on the C4 pads (58P) that are exposed from the opening 26. A filling resin 102 that seals the IC chip is filled in the opening 26.

FIG. 2B illustrates a second application example (POP module) 300 of the printed wiring board 10 of the present embodiment. In the second application example, a second package substrate 330 is mounted on the semiconductor device 220 via connecting bodies (76SO). The second package substrate 330 includes an upper substrate 310 and an electronic component 290 such as a memory that is mounted on the upper substrate. The connecting bodies (76SO) are respectively formed on the second terminals (36S) that are respectively exposed by the upper side openings (31S). In FIG. 2B, the connecting bodies (76SO) are solder bumps (76SO). Examples of the connecting bodies other than solder bumps are metal posts (not illustrated in the drawings) such as plating posts or pins. The plating posts or pins each have a shape of a circular cylinder. A right circular cylinder is preferred.

A mold resin 302 that seals the electronic component 290 is formed on the upper substrate 310.

The printed wiring board 10 may have solder bumps (76F), which are for connecting to a motherboard, on the pads (73F) that are exposed from the openings (71F) of the solder resist layer (70F) on the build-up layer.

The filling resin 102 that seals the IC chip, and the insulating layer 30 that forms the first circuit substrate 130, are each formed from a resin that contains inorganic particles but does not contain a core material. An example of the resin is a resin that primarily contains an epoxy resin or a BT (bismaleimide triazine) resin. Examples of the inorganic particles include particles formed from at least one selected from a group of an aluminum compound, a calcium compound, a potassium compound, a magnesium compound and a silicon compound. The examples of the inorganic filler further include silica, alumina, dolomite, and the like. In the first embodiment, it is preferable that the filling resin 102 and the insulating layer 30 be formed from the same material. At least, it is desirable that a difference between a coefficient of thermal expansion of the insulating layer 30 and a coefficient of thermal expansion of the filling resin 102 be less than 10 ppm/° C. Further, it is preferable that a difference between a content rate of the inorganic particles contained in the insulating layer 30 and a content rate of the inorganic particles contained in the filling resin 102 be less than 10% by weight. The filling resin 102 and the insulating layer 30 are formed of a material different from that of the first resin insulating layer 50 and the second resin insulating layer 150. The filling resin 102 and the insulating layer 30 contain 70-85% by weight of the inorganic particles and have a coefficient of thermal expansion (CTE) of 10 ppm/° C. The first resin insulating layer 50 and the second resin insulating layer 150 contain 40% by weight of the inorganic particles and have a coefficient of thermal expansion (CTE) of 39 ppm/° C. It is preferable that the difference in coefficient of thermal expansion between the insulating layer 30 and the filling resin 102 be less than the difference in coefficient of thermal expansion between the insulating layer 30 and the first resin insulating layer 50.

It is desirable that the content (percent by weight) of the inorganic particles contained in the filling resin 102 and the insulating layer 30 be 1.5 or more times the content (percent by weight) of the inorganic particles contained in the first resin insulating layer 50, and the coefficient of thermal expansion of the filling resin 102 and the insulating layer 30 be half or less than half the coefficient of thermal expansion of the first resin insulating layer 50. By forming the filling resin 102 and the insulating layer 30 using the same material, a crack is less likely to occur in the first resin insulating layer 50.

Since the printed wiring board of the first embodiment uses the highly rigid insulating layer 30, warpage of the printed wiring board can be reduced. In the printed wiring board of the first embodiment, the first resin insulating layer 50 and the second resin insulating layer 150 that are adjacent to the highly rigid insulating layer 30 contain a reinforcing material and have a high rigidity, and thus, a crack is unlikely to occur. Further, the third resin insulating layer 250, the fourth resin insulating layer 350 and the fifth resin insulating layer 450, which are distant from the insulating layer 30, do not contain a reinforcing material, and thus, an overall thickness can be reduced.

In the printed wiring board of the first embodiment, the pads (58P) for mounting an electronic component and the connection wires (58L) that connect the pads to the through-hole conductors 36 of the first circuit substrate 130 are formed in the mounting area (SMF). Since the pads can be connected to the through-hole conductors of the first circuit substrate by the connection wires (58L), the semiconductor element 90 mounted in the mounting area and the upper substrate 310 mounted on the first circuit substrate can be connected at a short distance. Therefore, a signal can be transmitted at a high speed.

The connection between the semiconductor element 90 and the upper substrate 310 is not routed in a U-shape in a direction away from the upper substrate via the via conductors 160. Therefore, an inductance component is not increased, and electrical characteristics of a signal line can be improved.

Method for Manufacturing Printed Wiring Board of First Embodiment

A method for manufacturing the printed wiring board 10 of the first embodiment is illustrated in FIG. 3A-8D.

A support plate (20z) and a metal foil 24 are prepared (FIG. 3A). In FIG. 3A, the metal foil 24 is laminated on the support plate (20z). Examples of the support plate (20z) include a metal plate and a double-sided copper-clad laminated plate. Examples of the metal foil 24 include a copper foil and a nickel foil.

Figure 3B:
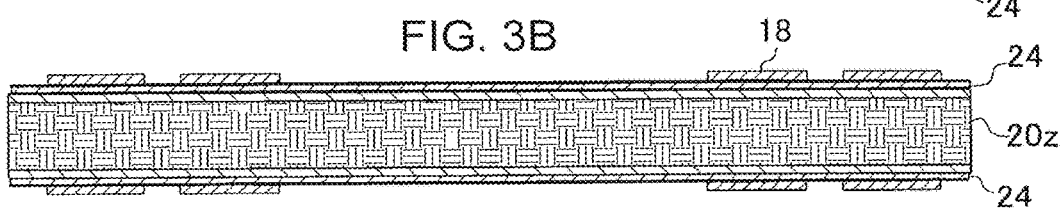
Figure 3C:
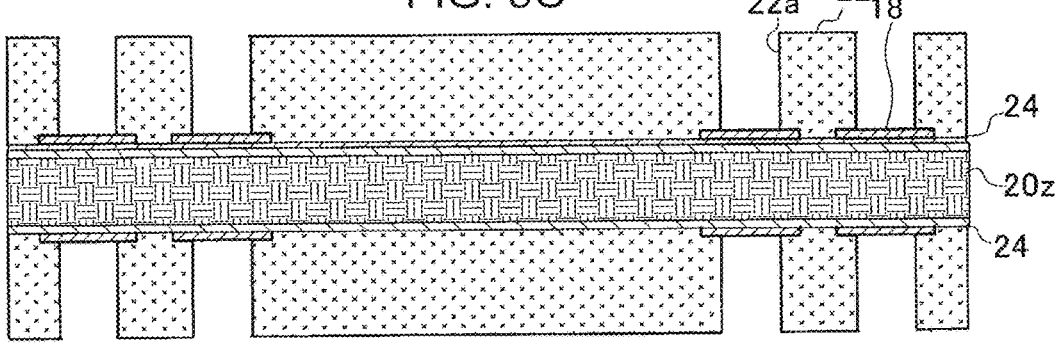
Figure 3D:
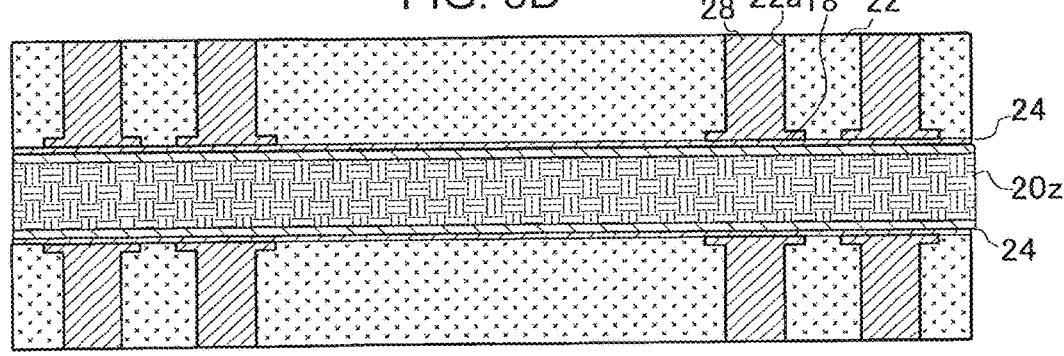
Figure 3E:
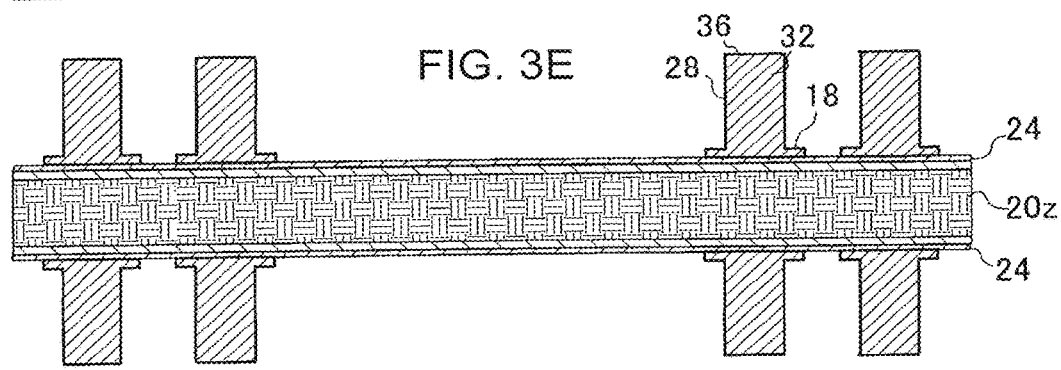

The embedded wirings 18 are formed on the metal foil 24 by electrolytic copper plating (FIG. 3B). However, it is possible that the embedded wirings 18 are not formed. In this case, the metal posts 32 may be directly formed on the metal foil 24. A plating resist 22 having openings (22a) for forming metal posts are formed (FIG. 3C). An electrolytic plating film 28 is formed in each of the openings (22a) of the plating resist (FIG. 3D). The plating resist is removed. The metal posts 32 are respectively formed from the electrolytic plating films 28, and the through-hole conductors 36 that each include an embedded wiring 18 and a metal post 32 are completed (FIG. 3E). The metal posts 32 are respectively formed from the electrolytic plating films only.

The insulating layer 30 is formed on the metal posts 32 and on the metal foil 24 from a mold resin, and a first intermediate (30a) is completed, which includes the metal foil 24, the insulating layer 30 and the metal posts 32 (FIG. 4A). Content of inorganic particles of the insulating layer 30 is 70-85% by weight. A surface of the insulating layer 30 and the particles posts 32 are polished (FIG. 4B).

Figure 6A:
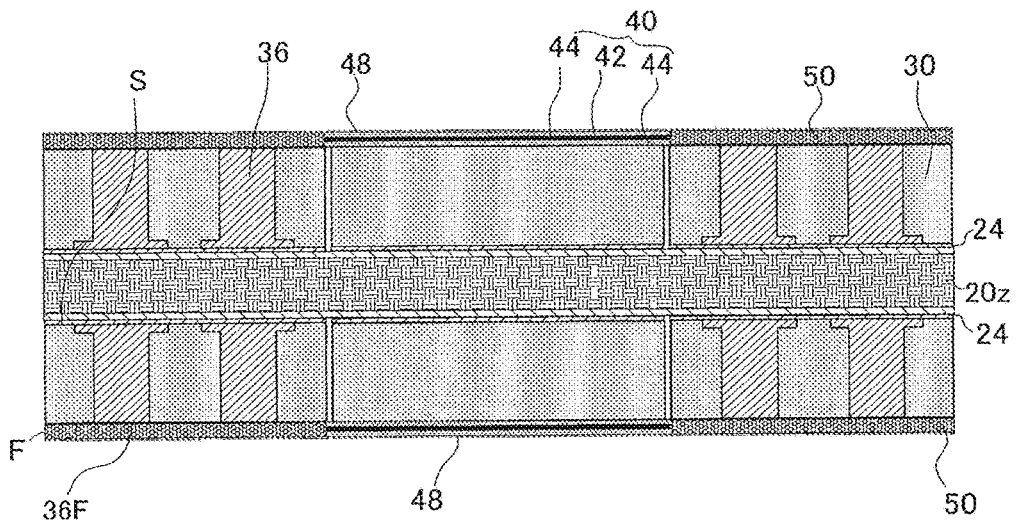
FIGS. 6A and 6B are manufacturing process diagrams of the printed wiring board of the first embodiment.
Figure 6B:
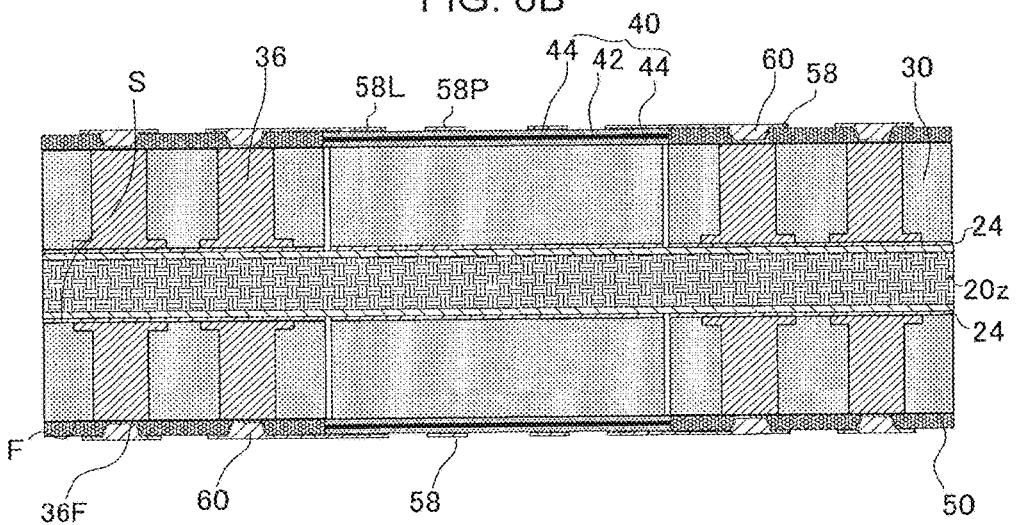

A frame-shaped groove (3013), which reaches the support plate (20z) and is for forming an opening for accommodating an electronic component, is formed in a central portion of the insulating layer 30 using laser (FIG. 4C). In this case, through-hole conductors 36 may also be formed in a portion surrounded by the frame-shaped groove (30β). This allows localized stress concentration and warpage due to uneven distribution of conductors to be suppressed. Further, it allows the portion surrounded by the frame-shaped groove (30β) to be easily peeled off. A release layer 40 is provided so as to cover the frame-shaped groove (30β). The release layer 40 is formed by respectively laminating release films (44, 44) on both sides of a polyimide film 42 (FIG. 5A). A film (50α) for a resin insulating layer, in which an opening (50a) is formed that allows the release layer 40 to penetrate through, and a copper foil 48 are prepared (FIG. 5B). The film for a resin insulating layer and the copper foil 48 are laminated on the support plate (20z) and are thermally cured, and the first resin insulating layer 50 is formed (FIG. 6A). The via conductors 60 that penetrate the first resin insulating layer 50 are formed, and the conductor layer 58 is formed on the first resin insulating layer. The conductor layer 58 includes the pads (58P) and the connection wires (58L). The second resin insulating layer 150 is formed on the first resin insulating layer. The via conductors 160, which penetrate the second resin insulating layer, and the conductor layer 158 are formed. As a result, the first build-up layer 55 is completed, which includes the first resin insulating layer 50, the second resin insulating layer 150, the via conductors 60, 160, and the conductor layers (58, 158) (FIG. 7A).

The third resin insulating layer 250 is formed on the second resin insulating layer 150 and the conductor layer 158, and the via conductors 260, which penetrated the third resin insulating layer, and the conductor layer 258 are formed. The fourth resin insulating layer 350 is formed on the third resin insulating layer 250 and the conductor layer 258, and the via conductors 360, which penetrate the fourth resin insulating layer, and the conductor layer 358 are formed. The fifth resin insulating layer 450 is formed on the fourth resin insulating layer 350 and the conductor layer 358, and the via conductors 460, which penetrated the fifth resin insulating layer, and the conductor layer 458 are formed. As a result, the second build-up layer 255 is completed, which includes the third resin insulating layer 250, the fourth resin insulating layer 350, the fifth resin insulating layer 450, the via conductors (260, 360, 460), and the conductor layers (258, 358, 458). The solder resist layer (70F) having the openings (71F) is formed on the fifth resin insulating layer 450. As a result, a second intermediate (300a) is formed (FIG. 7B).

Figure 8A:
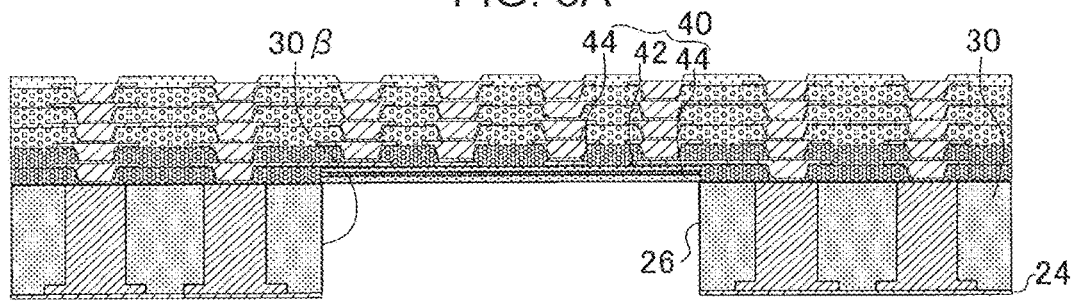
FIG. 8A-8D are manufacturing process diagrams of the printed wiring board of the first embodiment.
Figure 8B:
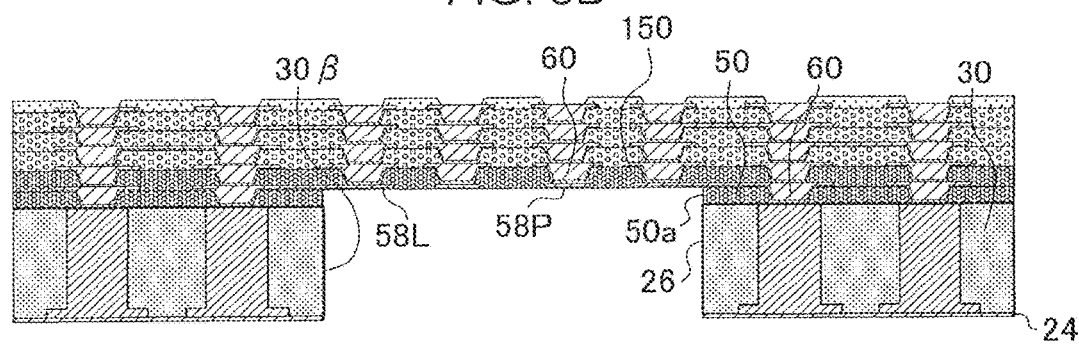
Figure 8C:
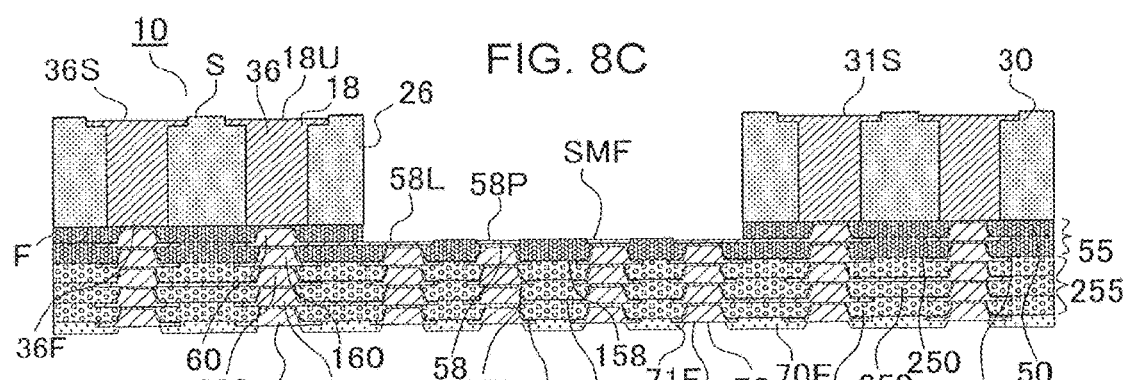
Figure 8D:
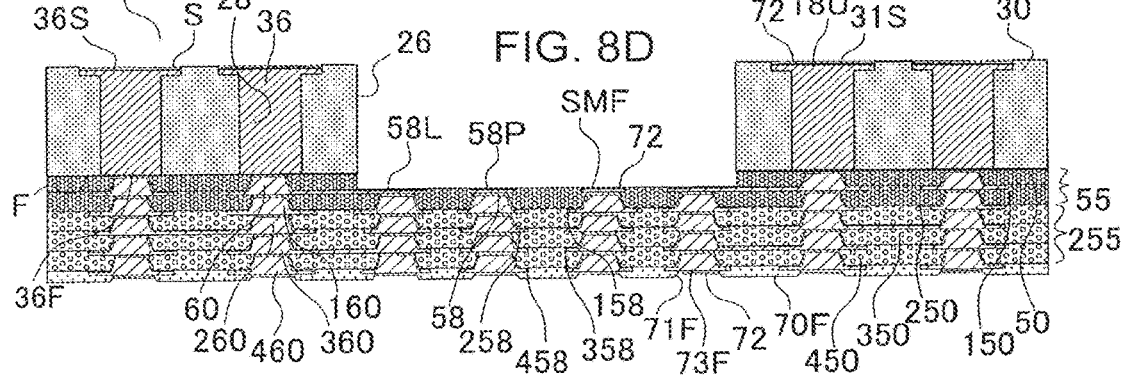

The second intermediate (300a) is separated from the support plate (20z), and the frame-shaped groove (30β) is exposed (FIG. 7C). By peeling off a portion (30d) surrounded by the frame-shaped groove in the insulating layer 30, the opening 26 is formed (FIG. 8A). The release layer 40 is removed. A portion of the second resin insulating layer 150 is exposed as the mounting area in the opening 26 (FIG. 8B). By etching, the metal foil 24 is removed and the upper surfaces (18U) of the embedded wirings 18 are recessed from the second surface (S) of the insulating layer 30, and the pads (58P) and the portions of the connection wires (58L) that are exposed from the opening 26 are reduced in thickness (FIG. 8C). Then, by Ni plating and Au plating, the protective films 72 are respectively formed on the upper surfaces (18U) of the embedded wirings 18 and on the pads (73F).

The IC chip 90 is mounted on the printed wiring board via the solder bumps (76SI) on the C4 pads (73SI), and the IC chip is sealed by the filling resin (mold resin) 102. The first package substrate (semiconductor device) 220 is completed (FIG. 2A). The IC chip is accommodated in the opening. The IC chip does not extend to the outside of the opening 26. The second package substrate 330 is mounted on the first package substrate 220 via the solder bumps (76SO) (FIG. 2B). The POP substrate (application example) 300 is completed. However, it is also possible that the solder bumps (76SI) are not formed on the C4 pads (73SI) but on pads on the IC chip side.

Second Embodiment

Figure 10:
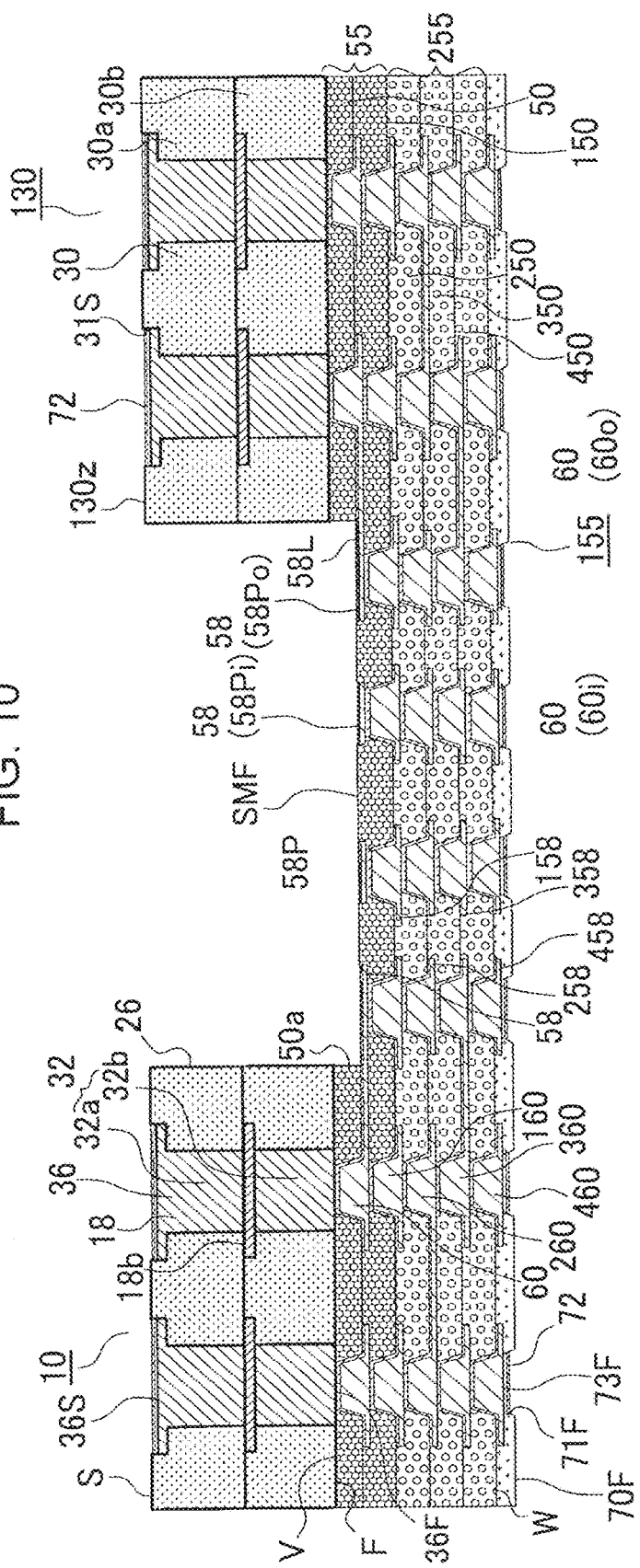
FIG. 10 is a cross-sectional view of a printed wiring board according to a second embodiment of the present invention.

FIG. 10 illustrates a cross section of a printed wiring board 10 of a second embodiment.

Metal posts 32 of an insulating layer 30 of the printed wiring board 10 of the second embodiment are each formed to have a two-stage structure that includes a first metal post (32a) and a second metal post (32b). An embedded wiring (18b) is interposed between the first metal post (32a) and the second metal post (32b). The insulating layer 30 is formed to have a two-layer structure that includes a first insulating layer (30a) and a second insulating layer (30b). The first metal post (32a) is embedded in the first insulating layer (30a). The second metal post (32b) is embedded in the second insulating layer (30b). However, it is also possible that the embedded wiring (18b) between the first metal post (32a) and the second metal post (32b) is provided or not provided.

Method for Manufacturing Printed Wiring Board of Second Embodiment

A method for manufacturing the printed wiring board 10 of the second embodiment is illustrated in FIG. 11A-12C.

Figure 11A:
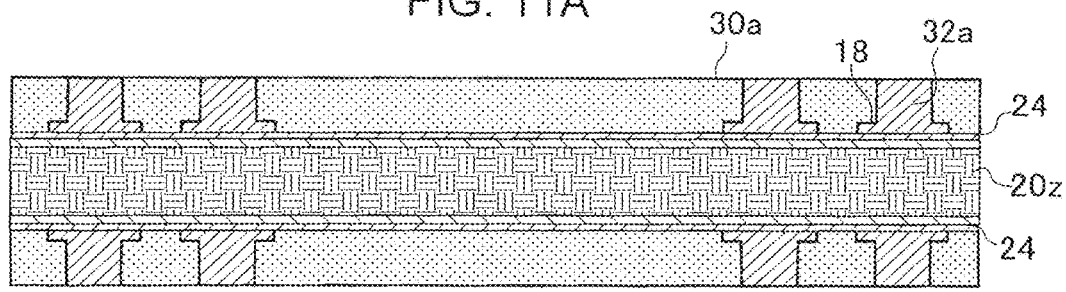
FIG. 11A-11C are manufacturing process diagrams of the printed wiring board of the second embodiment.

Similar to the above-described first embodiment, the embedded wirings 18, the first metal posts (32a) and the first insulating layer (30a) are formed on the metal foil 24 of the support plate (20z) (FIG. 11A). The first insulating layer (30a) is formed from a mold resin. Here, a thickness of the first insulating layer (30a) is half that of the insulating layer 30 of the first embodiment. Therefore, a height of the first metal posts (32a) that are formed by electrolytic plating is half that of the metal posts 32 of the first embodiment, and the first metal posts (32a) can be formed in a short time.

Figure 11B:
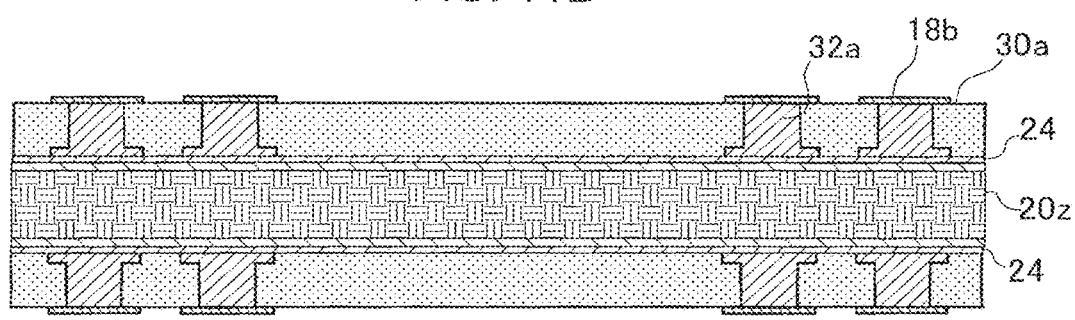
Figure 11C:
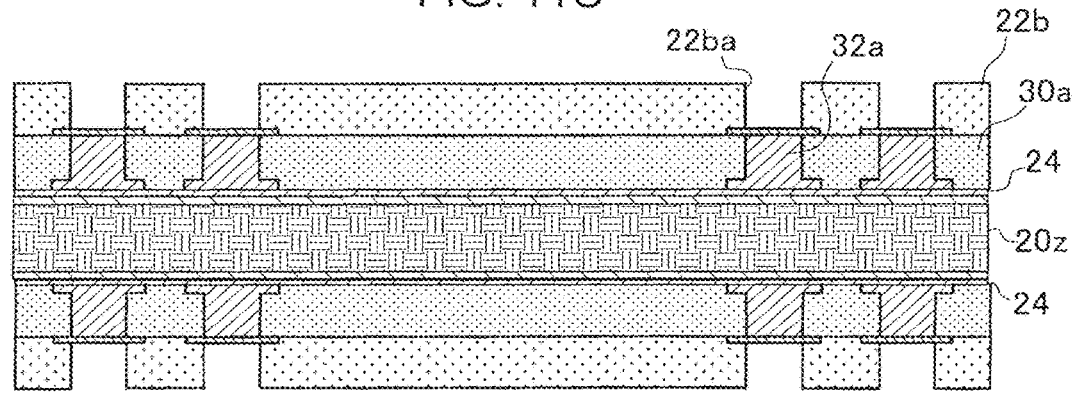
Figure 12A:
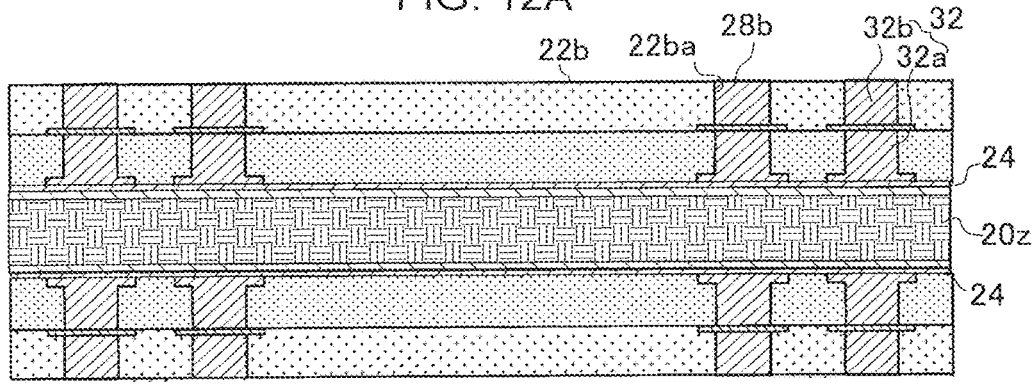
FIG. 12A-12C are manufacturing process diagrams of the printed wiring board of the second embodiment.
Figure 12B:
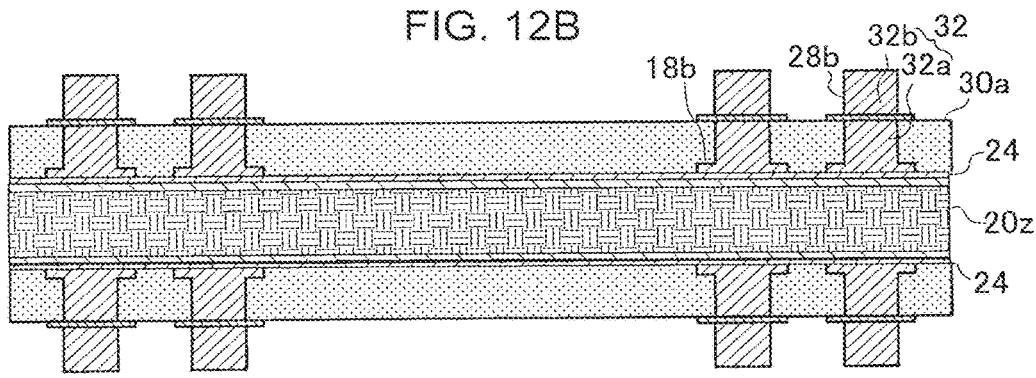
Figure 12C:
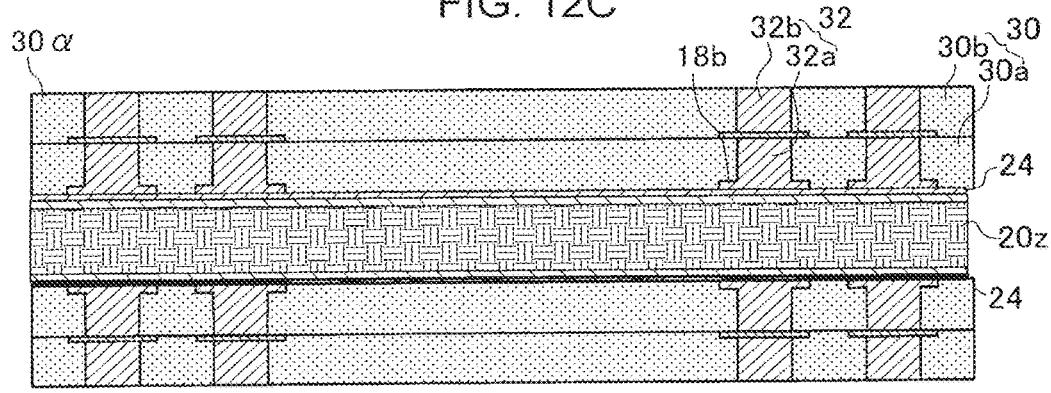

The embedded wirings (18b) are respectively formed on the first metal posts (32a) (FIG. 11B). A plating resist (22b) having openings (22ba) for forming the second metal posts are formed (FIG. 11C). An electrolytic plating film (28b) is formed in each of the openings (22ba) of the plating resist (FIG. 12A). The plating resist is removed. The second metal posts (32b) are formed from the electrolytic plating films (28b) (FIG. 12B).

The second insulating layer (30b) is formed on the second metal posts (32b) and on the first insulating layer (30a) from a mold resin, and a first intermediate (30a) is completed, which includes the metal foil 24, the first insulating layer (30a), the second insulating layer (30b), the first metal posts (32a) and the second metal posts (32b). The first insulating layer (30a) and the second insulating layer (30b) are formed using the same material. Content of inorganic particles of the first insulating layer (30a) and the second insulating layer (30b) is 70-85% by weight. A surface of the second insulating layer (30b) and the second metal posts (32b) are polished (FIG. 11C). The subsequent manufacturing processes are the same as in the first embodiment.

In the second embodiment, the thickness of each of the first insulating layer (30a) and the second insulating layer (30b) is half that of the insulating layer 30 of the first embodiment. Therefore, the height of each of the first metal posts (32a) and the second metal posts (32b) that are formed by electrolytic plating is half that of the metal posts 32 of the first embodiment, and the first metal posts (32a) and the second metal posts (32b) can be formed in a short time. Further, the metal posts 32 are each formed to have the two-stage structure that includes the first metal post (32a) and the second metal post (32b). Therefore, a stress can be relaxed by the metal posts.

In a package substrate, connection between a first semiconductor element mounted in a mounting area and a second semiconductor element mounted on a cavity substrate may be routed through inside of a base substrate, and thus is routed once in a direction away from the second semiconductor element, so signal transmission is likely to take a longer time.

A printed wiring board according to an embodiment of the present invention includes: a second circuit substrate that has a mounting area, a third surface, and a fourth surface that is on an opposite side of the third surface; and a first circuit substrate that is laminated on the third surface of the second circuit substrate, has a first surface and a second surface that is on an opposite side of the first surface, has an opening for exposing the mounting area, and has a through-hole conductor that connects the first surface and the second surface. The first surface of the first circuit substrate and the third surface of the second circuit substrate oppose each other. A pad for mounting an electronic component and a connection wire that connects the pad to the through-hole conductor of the first circuit substrate are formed in the mounting area.

In the printed wiring board according to an embodiment of the present invention, the pad for mounting an electronic component and the connection wire that connects the pad to the through-hole conductor of the first circuit substrate are formed in the mounting area. Since the pad can be connected to the through-hole conductor of the first circuit substrate by the connection wire, a semiconductor element mounted in the mounting area and a semiconductor element mounted on the first circuit substrate can be connected at a short distance. Therefore, a signal can be transmitted at a high speed, and electrical characteristics of a signal line can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first circuit substrate having a first surface and a second surface on an opposite side with respect to the first surface; and
a second circuit substrate having a third surface and a fourth surface on an opposite side with respect to the third surface such that the first circuit substrate is laminated on the third surface and that the first surface and the third surface are opposing each other,
wherein the second circuit substrate has a mounting area on the third surface and comprises a plurality of pads positioned to mount an electronic component in the mounting area, a connection wire structure connected to the plurality of pads, and a first resin insulating layer having an opening portion exposing the plurality of pads formed in the mounting area, the first circuit substrate comprises a plurality of through-hole conductors extending from the first surface to the second surface and connected to the plurality of pads through the connection wire structure and has an opening portion formed through the first circuit substrate such that the opening portion is exposing the plurality of pads formed in the mounting area, and the second circuit substrate comprises a plurality of via conductors formed in the first resin insulating layer of the second circuit substrate such that the plurality of via conductors is connecting the connection wire structure and the through-hole conductors, respectively, and that the via conductors, the pads and the connection wire structure comprise same conductor material forming an integral conductor structure comprising the via conductors, the pads and the connection wire structure.

2. A printed wiring board according to claim 1, wherein the second circuit substrate comprises a second resin insulating layer having the mounting area in which the plurality of pads is formed.

3. A printed wiring board according to claim 2, wherein the first circuit substrate comprises an insulating layer which does not contain a reinforcing material, and the second circuit substrate comprises the first and second resin insulating layers such that each of the first and second resin insulating layers comprises a reinforcing material.

4. A printed wiring board according to claim 1, wherein the first circuit substrate comprises the plurality of through-hole conductors comprising a plurality of metal posts, respectively.

5. A printed wiring board according to claim 4, wherein the plurality of metal posts is formed such that the plurality of metal posts has a plurality of surfaces substantially on a same plane with the first surface, respectively.

6. A printed wiring board according to claim 2, wherein the first circuit substrate comprises the plurality of through-hole conductors comprising a plurality of metal posts, respectively, the plurality of metal posts is formed such that the plurality of metal posts has a plurality of surfaces substantially on a same plane with the first surface, respectively, and the second circuit substrate comprises the plurality of via conductors formed in the first resin insulating layer of the second circuit substrate such that the plurality of via conductors is positioned to connect with the surfaces of the metal posts, respectively.

7. A printed wiring board according to claim 3, wherein the second circuit substrate comprises a third resin insulating layer on which the second resin insulating layer is formed such that the third resin insulating layer is formed on an opposite side with respect to the mounting area of the second resin insulating layer and does not contain a reinforcing material.

8. A printed wiring board according to claim 2, wherein the first circuit substrate comprises the plurality of through-hole conductors comprising a plurality of metal posts, respectively.

9. A printed wiring board according to claim 8, wherein the plurality of metal posts is formed such that the plurality of metal posts has a plurality of surfaces substantially on a same plane with the first surface, respectively.

10. A printed wiring board according to claim 3, wherein the first circuit substrate comprises the plurality of through-hole conductors comprising a plurality of metal posts, respectively, the plurality of metal posts is formed such that the plurality of metal posts has a plurality of surfaces substantially on a same plane with the first surface, respectively, and the second circuit substrate comprises the plurality of via conductors formed in the first resin insulating layer of the second circuit substrate such that the plurality of via conductors is positioned to connect with the surfaces of the metal posts, respectively.

11. A printed wiring board according to claim 10, wherein the second circuit substrate comprises a third resin insulating layer on which the second resin insulating layer is formed such that the third resin insulating layer is formed on an opposite side with respect to the mounting area of the second resin insulating layer and does not contain a reinforcing material.

12. A printed wiring board according to claim 3, wherein the first circuit substrate comprises the plurality of through-hole conductors comprising a plurality of metal posts, respectively.

13. A printed wiring board according to claim 12, wherein the plurality of metal posts is formed such that the plurality of metal posts has a plurality of surfaces substantially on a same plane with the first surface, respectively.

14. A printed wiring board according to claim 1, wherein the first circuit substrate comprises the plurality of through-hole conductors comprising a plurality of metal posts, respectively, the plurality of metal posts is formed such that the plurality of metal posts has a plurality of surfaces substantially on a same plane with the first surface, respectively, and the second circuit substrate comprises the plurality of via conductors formed in the first resin insulating layer of the second circuit substrate such that the plurality of via conductors is positioned to connect with the surfaces of the metal posts, respectively.

15. A printed wiring board according to claim 7, wherein the first circuit substrate comprises the plurality of through-hole conductors comprising a plurality of metal posts, respectively.

* * * * *